United States Patent
Hartner et al.

(10) Patent No.: US 7,351,642 B2
(45) Date of Patent: Apr. 1, 2008

(54) DEGLAZE ROUTE TO COMPENSATE FOR FILM NON-UNIFORMITIES AFTER STI OXIDE PROCESSING

(75) Inventors: Walter Hartner, Bad Abbach (DE); Joseph Page, Mechanicsville, VA (US); Jonathan Davis, Shanghai (CN)

(73) Assignee: Infineon Technologies Richmond, LP, Sandston, VA (US)

( * ) Notice: Subject to any disclaimer, the term of this patent is extended or adjusted under 35 U.S.C. 154(b) by 329 days.

(21) Appl. No.: 11/036,536

(22) Filed: Jan. 14, 2005

(65) Prior Publication Data

US 2006/0160324 A1    Jul. 20, 2006

(51) Int. Cl.
    *H01L 21/76*    (2006.01)
(52) U.S. Cl. .......... 438/424; 438/692; 438/748; 216/91; 216/92
(58) Field of Classification Search .......... 438/424
    See application file for complete search history.

(56) References Cited

U.S. PATENT DOCUMENTS

| | | | |
|---|---|---|---|
| 5,942,449 | A | 8/1999 | Meikle |
| 6,140,233 | A | 10/2000 | Kwag et al. |
| 6,169,038 | B1 | 1/2001 | Kruwinus et al. |
| 6,423,640 | B1 * | 7/2002 | Lee et al. .......... 438/690 |
| 2003/0087528 | A1 | 5/2003 | Kruwinus et al. |

FOREIGN PATENT DOCUMENTS

| | | |
|---|---|---|
| DE | 199 28 570 A1 | 12/1999 |
| EP | 0 905 754 A2 | 3/1999 |
| WO | WO 01/06555 | 1/2001 |

OTHER PUBLICATIONS

New Chemical Etching to Correct Film Thickness Distribution and Its Impact on CMP; Surface Prep News, 4th Quarter 2002, pp. 1, 3.
Office Action issued in conterpart German application No. DE 10 2005 062 915.6 on Apr. 25, 2007 (3 pages).

* cited by examiner

*Primary Examiner*—Carl Whitehead, Jr.
*Assistant Examiner*—Colleen E. Rodgers
(74) *Attorney, Agent, or Firm*—Brinks Hofer Gilson & Lione

(57) ABSTRACT

A process and method for compensating for a radial non-uniformity on a wafer that includes the steps of: centering a rotational thickness non-uniformity of a film on the wafer about the axis of the spin susceptor following a CMP process; positioning a nozzle in the spin processing unit to direct the etching solution along a radius of the wafer; adjusting the flow of the etching solution from the nozzle; adjusting the rotational speed of the spin susceptor to control the residence time of the etching solution; and coordinating the rotational speed of the spin susceptor, flow of etching solution and positioning of the nozzle to maximize the removal of material. The process may be utilized to compensate for the bowl-shaped non-uniformities of an STI oxide. These non-uniformities are compensated for and addressed after a CMP process.

21 Claims, 6 Drawing Sheets

DEGLAZE ROUTE TO COMPENSATE FOR FILM NON-UNIFORMITIES AFTER STI OXIDE PROCESSING

BACKGROUND

1. Technical Field

The present invention relates to the planarizing of a substrate surface during electronic device processing.

2. Background Information

Integrated circuits have been formed in a planarized fashion on silicon substrates for many years. The integrated circuit has rapidly decreased in size and the number of devices that are formed on the silicon wafer number in the millions. The diameters of the silicon wafers have continued to increase from the 50 mm wafers in the 1960s to the 200 mm and 300 mm wafers that are common on the IC fabrication lines today.

As the wafers increased in size, the manufacturing problems became more complex. The processing techniques that were engineered for 200 mm wafer tools are now used to process the 300 mm wafers. Problems, such as temperature non-uniformities across the surface of a wafer, are much more difficult to control on 300 mm wafers with techniques developed for 200 mm wafers that present less than half the surface area.

Such temperature non-uniformities present film non-uniformities that are deposited across the surface of the wafer. A temperature variation of just 5 degrees Celsius may deposit material at different growth rates in localized areas on the wafer. Growth characteristics are not only related to temperature but may be effected by other parameters such as growth chamber pressure, cracking efficiency of the source materials, diffusion coefficients of the individual constituents of the species, and the vapor pressure of the reactants.

Many deposition processes occur in reactors using susceptors that rotate during deposition. The rotating susceptor alleviates gross non-uniform deposition patterns on the substrate. However, the non-uniformities still exist but are less severe and the patterns are generally rotational. Many deposition processes leave a thicker pattern on the outer edge of the wafer.

For instance, many processes are performed in a horizontal reactor where the gases pass across the wafer. As the gases flow across the wafer, the source material cracks and deposits material forming the film and depleting the carrier gas of source material. Thus, the growth rate slows as the gas flows across the wafer. Therefore, the growth rate for the film is highest at the leading edge of the substrate and lowest at the trailing edge. Rotating the wafer tends to offset the depletion effects of the source material by rotating the wafer through the varying growth rates making the average growth rate across the wafer much more uniform. However, it is difficult to match the rotation of the wafer to the exact growth rate in any one area of the wafer. Therefore, the thickest areas of the film in a horizontal reactor may occur at the outside radius of the substrate.

As the line-widths of electronic devices become smaller, the photo-lithographic processes that form the masking layers for defining the line-widths may require shorter wavelengths of light to properly expose the photo-resist. Photolithography is a process used for defining a pattern on a wafer using wavelengths in the ultraviolet wavelength range. Since film non-uniformities demonstrate a material of varying thickness across the surface of the wafer, the focusing of the light to properly expose the photo-resist becomes difficult. As the film thickness changes across the wafer so do the focal points for the photolithography process, resulting in poorly-formed line-widths.

Since the deposition of materials may leave a textured surface, techniques such as chemical-mechanical polishing ("CMP") have been developed to planarize the surface of the wafer. For the most part, CMP has resolved the depth of focus problem for the photo-lithographic processes. However, not all exposed materials are etched and polished at the same rate during the CMP process. Some materials are harder than others, resisting both the mechanical polishing and etching thus leaving features with residual layer material.

BRIEF SUMMARY

This application provides a process to compensate for the bowl-shaped oxide non-uniformity that may be prevalent on processed wafers, particularly after shallow trench isolation ("STI") processing. STI processing is a method used to provide isolation of transistors from one another and other devices on a substrate. It is commonly used for providing isolation in complementary metal oxide semiconductor transistors but may find applications in other device structures. STI processing may be followed by a chemical mechanical polishing ("CMP") process that will tend to form a planarized surface. However, the STI oxide or other materials in the shallow trenches still may demonstrate non-uniformities or residual layer material in and on surface features requiring a follow-on etching process. The etching may be performed on a spinning susceptor that may vary in speed for increasing or decreasing the residence time of the etchant on the wafer. The nozzle that applies the etchant solution may move in a radial direction to apply the etching solution to the area of the wafer needing layer removal. As the film may be non-uniform in the radial direction, this allows for the etching action to occur only on those areas where the film is thickest. The radial pattern may be centered on the center of the wafer or off-center depending upon the tool and process for depositing the film.

The etching solution may be tailored to target the material and the region demonstrating the non-uniformity on the wafer. The process may address areas of non-uniform film thickness that were measured in special wide trenches after the CMP process since the measurement of the material in the shallow trenches is difficult. The materials may include and are not limited to silicon oxides, nitrides or metals. These materials may be found in the shallow isolation trenches or deep trenches used for trench capacitors where the layer material may remain protected from the mechanical action of the CMP process. By mounting the wafer on a spinning susceptor such as that found in a single wafer wet process tool, the etching may take place so that follow-on processing may occur successfully.

Other systems, methods, features and advantages of the invention will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

The invention can be better understood with reference to the following drawings and description. The components in the figures are not necessarily to scale, emphasis instead being placed upon illustrating the principles of the invention. Moreover, in the figures, like referenced numerals designate corresponding parts throughout the different views.

DETAILED DESCRIPTION OF THE DRAWINGS AND THE PRESENTLY PREFERRED EMBODIMENTS

Figure 1:
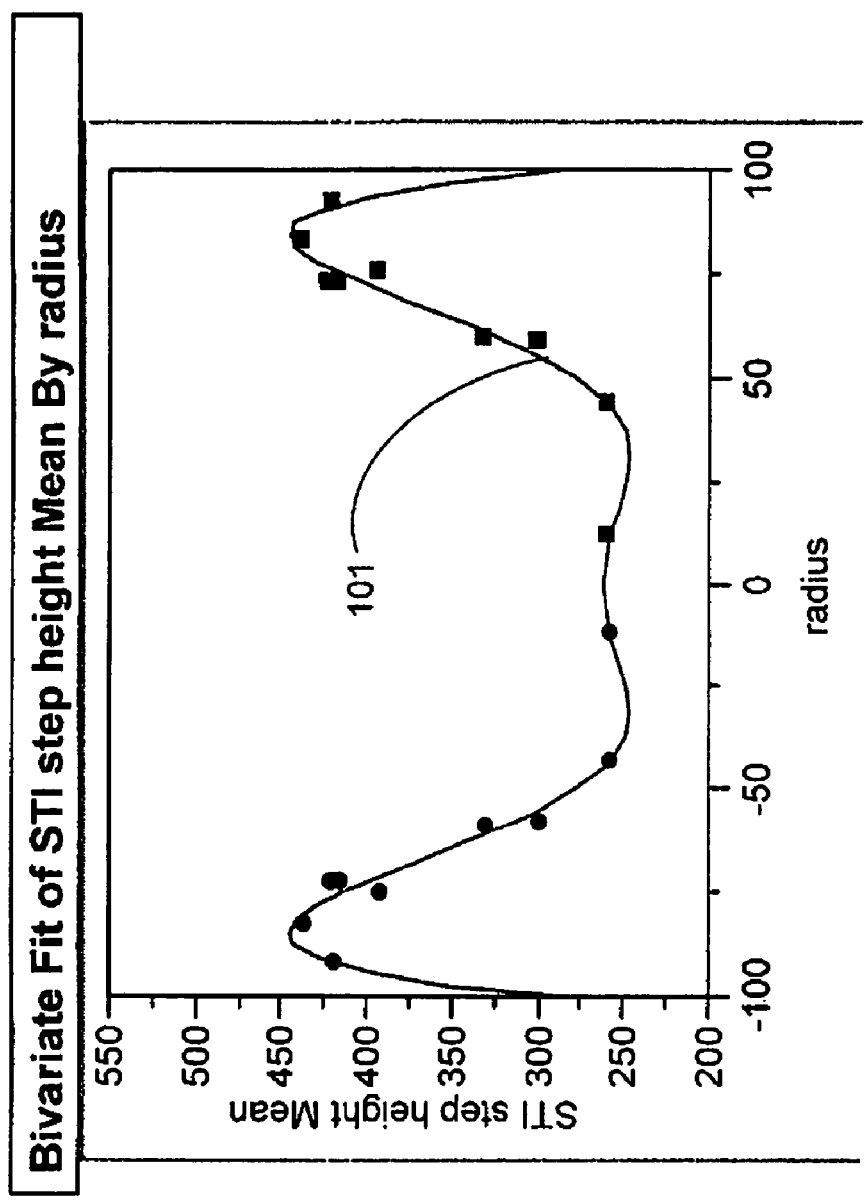
FIG. 1 is a graph of a measurement of a film thickness on a wafer.

A process to compensate for non-uniformities after a shallow trench isolation ("STI") oxide process and a chemical-mechanical polish process ("CMP") is utilized to remove material resulting from non-uniform layer thicknesses. FIG. 1 plots a film thickness profile 101 on a wafer as a function of radius from the wafer center. A typical film on a wafer may exhibit a non-uniformity that is shown in the graph 101 of FIG. 1. This non-uniformity is referred to as a bowl-shaped non-uniformity because it appears to form a cross-sectional view of a bowl, but non-uniformities of other patterns may be included. The pattern of FIG. 1 represents an oxide that may be a silicon oxide used as an insulator or dielectric film in the processing of devices on a silicon substrate. In this example, the process of forming the film deposits more material at the outer portion of the wafer having the profile 101, where the radius of the wafer exceeds 50 mm, than at the center of the wafer. An etching process may remove this excess material later, but in the meantime, different materials may be deposited on the non-uniformity during the formation of the circuit.

Figure 2:
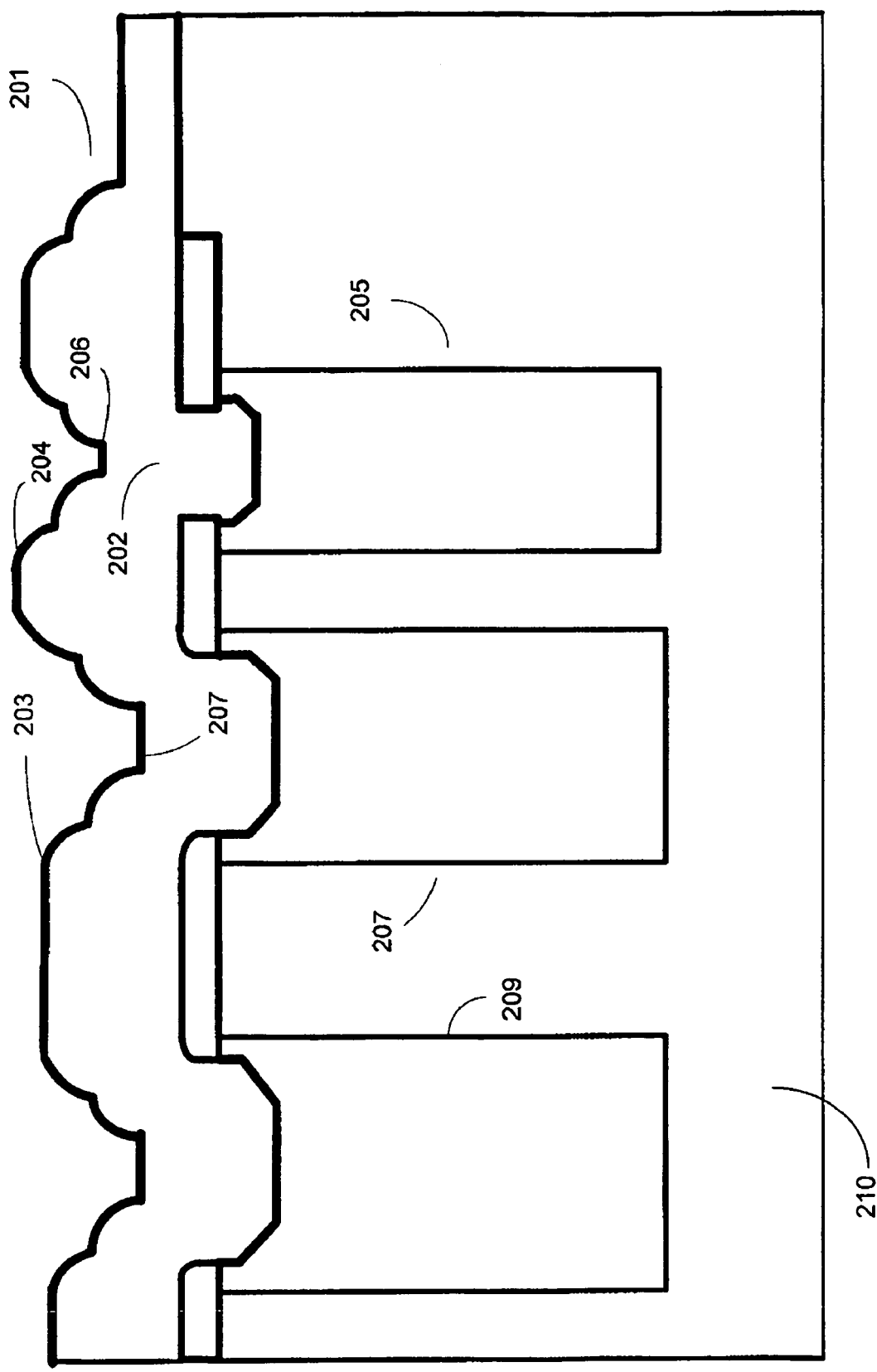
FIG. 2 is a diagram of a layer deposition across shallow trenches.

For example, a trench for isolation purposes or for a trench capacitor may be formed in the substrate. Later, a film, containing polysilicon or a silicon oxide, may be deposited over the surface of the wafer filling the trench. Other films may include materials such as high-density plasma silicon oxides, nitrides formed in LPCVD processes, and tetraethyl-orthosilicate ("TEOS"). In addition, the film layers may include metals such as copper, aluminum, copper alloys, aluminum alloys and metal silicides and other materials that may be used to process devices on a substrate. FIG. 2 is a diagram showing in cross section a layer 201 deposited across shallow trenches 205, 207, 209 on a semiconductor wafer 210. The trench may appear as any one of the examples shown in FIG. 2. In this example, there are three trenches 205, 207 and 209.

By way of example, the wafer 210 may have a silicon oxide film 201 formed on the surface of the wafer 210 with the film 201 covering the three trenches 205, 207, and 209. As mentioned previously, a layer 201 may include materials that are used for processing and masking the devices on the wafer 210 or substrate. As the film 201 is deposited, its thickness may vary across the wafer 210. These films may appear bowl-shaped like the profile 101 as shown in FIG. 1, thicker towards the edge of the wafer 210 than at the center of the wafer 210. In other instances, the non-uniformity may appear as a W-shape (not shown), thicker at the center and on the edges than at a location that may be at a point half-way between the center and the edge of the wafer. Other patterns may become apparent to those skilled in the art and are included within the scope of this invention.

Figure 3:
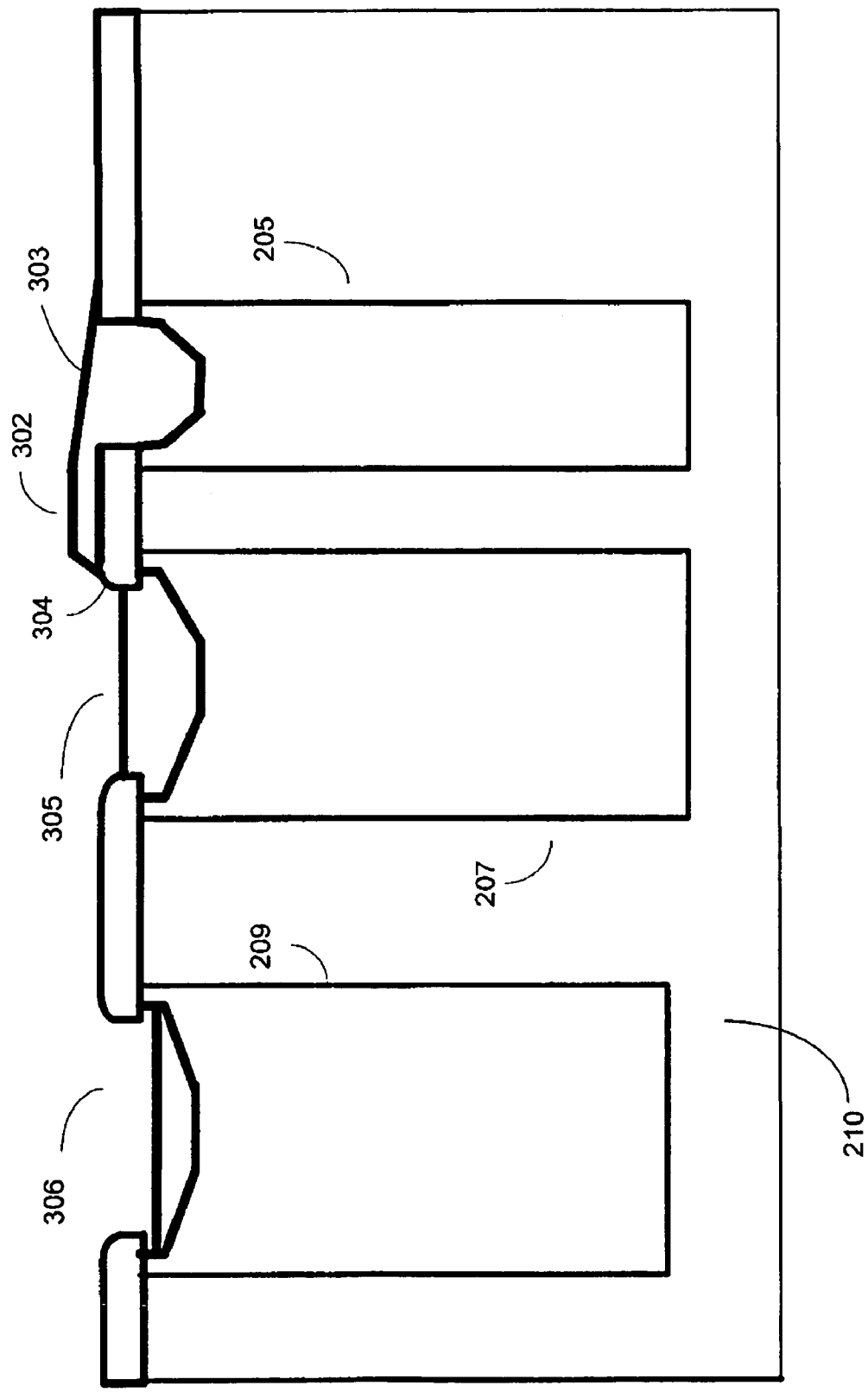
FIG. 3 is a diagram of shallow trenches after a CMP process.

When the layer 201 of FIG. 2 is removed in a CMP process, it may take the form of FIG. 3. FIG. 3 is a cross-section view of a semiconductor wafer 210. In FIG. 3, an oxide layer 303 and a nitride isolation layer have been formed on a top surface of the wafer 210. In FIG. 3, a portion of the oxide layer 302 may still adhere to the nitride isolation layer 304, creating a non-uniformity 302, 303 in the film 201.

Further, the material in the trenches 205, 207, 209 may not etch uniformly across the wafer because of the non-uniformity of the varying layer thickness 203 and 204 as shown in FIG. 2. In FIG. 3, the non-uniform area 302 of the film 201 that initially covered the trench 205, in some instances, may still fill the trench 205 after the CMP process. Therefore, a spin processing unit may be utilized to etch the radial non-uniformity patterns that exhibit different film thicknesses whether these non-uniformities 302 and 303 occur on the surface of the wafer or in a trench 205, 207 and 209. Preferably, this spin etch process occurs following the CMP process in order to take advantage of the etching action on the material in the shallow trenches.

Figure 4:
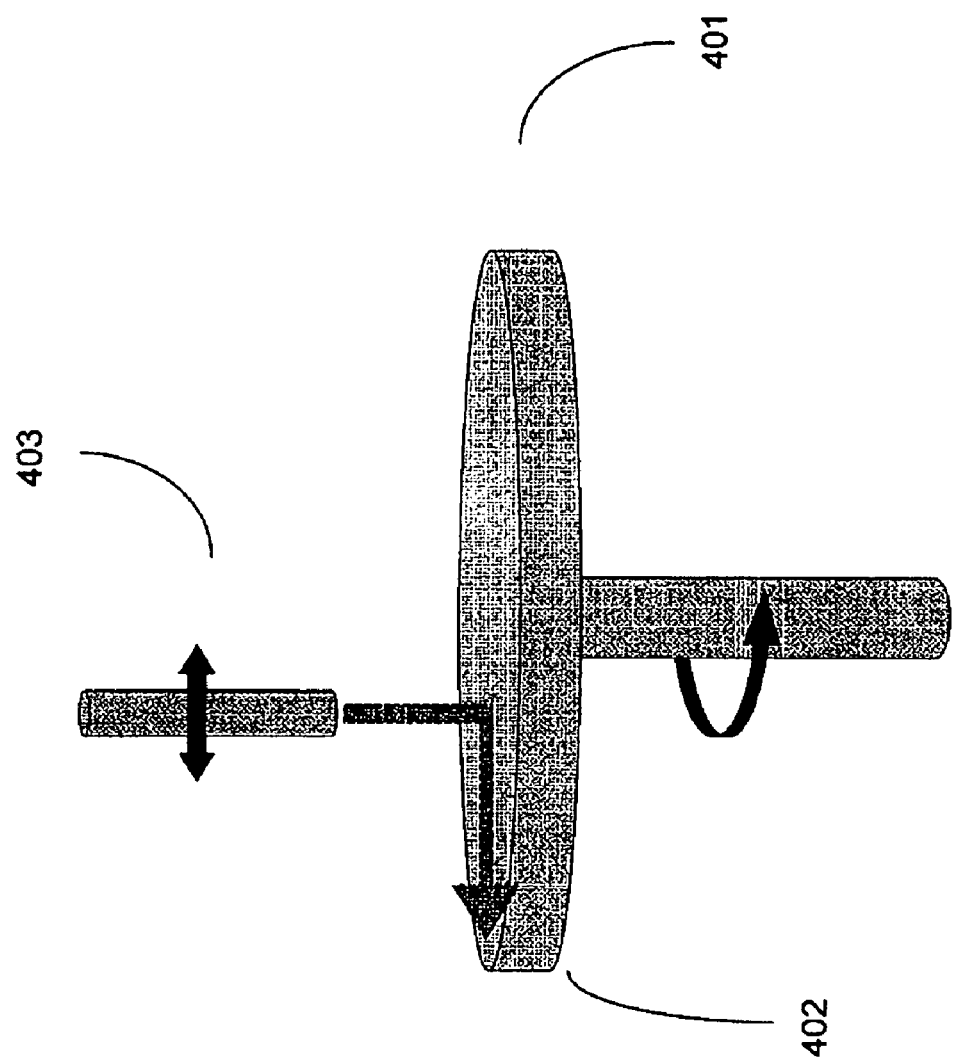
FIG. 4 is a schematic of a spin process unit.

For example, FIG. 4 is a schematic of a spin process unit. In FIG. 4, a spin process unit 401 may have a spin susceptor 402 and a nozzle 403. In operation, a wafer may be placed on the susceptor 402. The nozzle 403 may be positioned above the wafer and the spin susceptor 402 so that it may apply the etching solution and other fluids to various regions of the wafer. The nozzle 403 may move in a path along the radius of the wafer. In an alternative embodiment (not shown), the nozzle 403 may be fixed in one spot but pivot about a fixed point in order to apply the etch solution or other fluid along the radius of the wafer.

The spin susceptor 402 may hold one wafer of a specific size. The spin susceptor 402 will spin at varying rotational speeds so that the residence time of the etching solution on the wafer may be controlled. A faster speed causes the etching solution to travel faster across the surface of the wafer, minimizing the time that the etching solution contacts the material requiring removal. A slower speed allows a longer residence time for the solution to etch the layers.

The nozzle 403 may adjust the amount of etching solution and direct the placement of the etching solution to the wafer. The nozzle 403 also may be used to apply a rinsing solution such as de-ionized water to the surface to help remove the etching solution and stop the etching process. In addition, other fluids may be used to remove the etching solution and rinse the wafer. Further, the etching solution may be diluted by adding a system that will mix de-ionized water or another diluting fluid into the etching solution.

Figure 5:
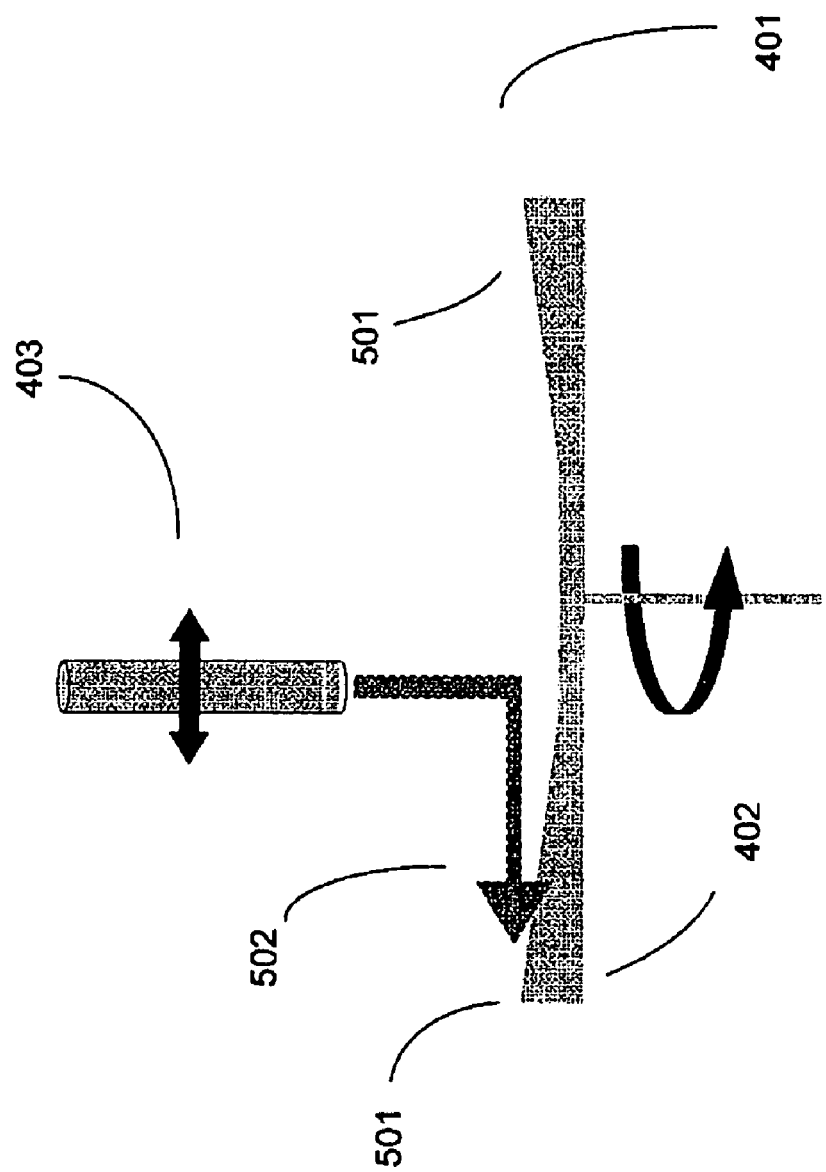
FIG. 5 is a schematic of a wafer exhibiting film non-uniformity in a spin process unit.

The nozzle 403 also may adjust the application of the solution in relation to the diameter of the wafer. In our example of FIG. 1, there is excess film material at the outer diameter of the wafer. FIG. 5 illustrates a wafer 501 with a non-uniformity mounted in a spin process unit on a spin susceptor 402. The nozzle 403 may direct the etching solution towards the outer diameter of the wafer to concentrate the etchant in the area where it is needed most as illustrated in FIG. 5. In this example, the film material at the edges of the wafer 501 is thicker than the material in the center of the wafer 501. It is emphasized that this drawing is not to scale and the dimensions of the actual film are very much smaller than those appearing in FIG. 5.

As is illustrated in FIG. 5, the susceptor 402 rotates, the nozzle 403 will direct the etching solution to the thicker material on the surface of the wafer 501. Since the film at the center of the wafer appears thinner in the ongoing example, the etching solution may not be necessary in that region. The nozzle 403 may direct the etching solution to a position 502 approximately where the non-uniformity is greatest. It is at this location that the nozzle 403 dispenses or applies the etching solution onto the wafer 501.

During the time that the etching solution is dispensed and applied to the wafer 501, the spin susceptor 302 rotates the wafer 501. The etching solution flows onto the wafer 501 and is forced to spread to the outer radius of the wafer 501 due to centrifugal forces. As the solution travels across the excess layer material, it etches the layer material. If the fluid is directed to the proper area, the solution may etch only the excess layer material. As the solution etches the film, the etchant is consumed to some extent, so the etching action may slow down as the fluid flows away from the dispensing point. Further, the volume of fluid per unit of area will decrease as the fluid travels further from the center of the wafer 501 and spreads out. Since the volume of the solution decreases per unit area, the etch rate may decrease as the fluid comes closer to the edge of the wafer. The nozzle 403 may move and apply the etching solution to areas that are near the edge of the wafer to compensate for the difference in etch rates at the edge versus the inner radius of the wafer 501.

In the example of FIG. 1, the wafer is flat from about the center to a radius of about 50 mm. At 50 mm, the thickness of the film profile 101 in FIG. 1 begins to increase as the distance from the center increases to a point where the maximum film thickness is almost 50% thicker than the film thickness at 50 mm from the center of the wafer. The etching solution may be applied at about this point. At the very edge of the wafer, the layer thickness rapidly decreases, so the nozzle may not direct or concentrate the etching solution beyond the point where the layer is thickest, at about a radius of 80 mm, to avoid thinning the layer at the very edge of the wafer.

Figure 6:
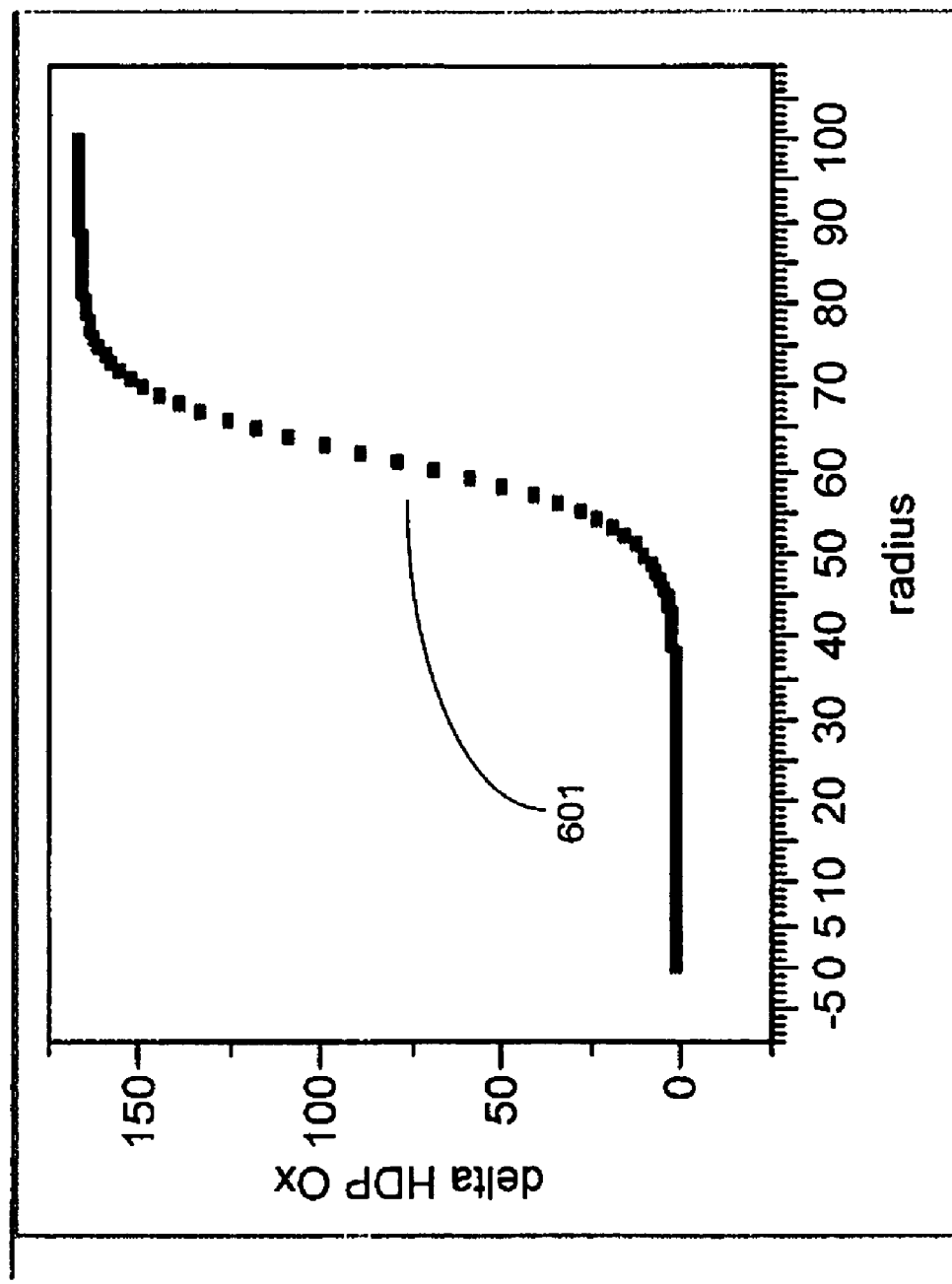
FIG. 6 is a graph showing an optimum placement of the nozzle.

FIG. 6 shows the optimal region 601 for applying the etching solution on the wafer to achieve the desired results. In the continuing example, the material to be removed is a silicon oxide, however it may be any material or combination of materials deposited on a substrate for processing devices. The etching solution for removing the oxide may be a hydrofluoric acid solution. If other materials are present instead or in addition to the silicon dioxide, other etching solutions may be substituted or added. The nozzle 403 may apply the etching solution to a region 601 varying the position of the nozzle 403 along the radius of the wafer that is between 50 to 75 mm from the center of the wafer. Applying the solution to this region may achieve an optimum layer uniformity upon completion of the etching process. If the thickness 501 can be monitored, the spin process unit 401 may control and coordinate the etching process by varying the position of the nozzle 403 by applying the etching solution to the thickest portion of the layer. The spin process unit 401 may also adjust the rotational speed of the spin susceptor 402 to change the residence time of the etching solution on the wafer. In this example the thickest region 601 of the layer begins at approximately 50 to 55 mm from the center of the wafer and extends to the edge. The nozzle 403 may direct the etching solution to a position corresponding to a point on the wafer where the step height is about 30 to 50% of the total thickness.

A step height is the distance between the top of a feature and the surface of the wafer. Put another way, it is the depth of a feature below the wafer surface. Further, the step height may be the distance from the surface of the wafer to the bottom of a trench or to the top of a filling material that might be in the trench. Such material may include polysilicon, silicon dioxide or other material that may be used for processing a wafer.

The interplay and relationship between the speed of the spin susceptor 402, the position of the nozzle 403 and the temperature of the etchant all play a role in the effectiveness and speed of the etch process. Further, should changes occur to the etching solution strength or to the temperature, the etching time may change. An etch process that has a real-time monitoring capability for film thickness may utilize all of the parameters including the spin susceptor 402 speed, nozzle 403 position, etch temperature and in rare instances the strength of the etch solution to control the etch process at the surface of the wafer.

The discussion of the non-uniformity of layer thicknesses in the preceding example applies to those materials that may reside in the trenches formed on the surface of the wafer. An example of the film thickness variation is shown in FIG. 2. During the deposition of the layer 201, the narrow shallow trench 205 filled quickly during the deposition of the layer material. Over the narrow trench 205, a layer of oxide 204 was deposited. This layer of oxide is relatively thick in comparison with the material 203 covering the other trenches 207, 209 that were wider. As shown in FIG. 3, since there was more material to be removed from the surface, the material below the surface of the wafer may be higher in one trench 305 when compared to another trench 304. This comparison also may hold true for a trench 207 that is formed towards the outer perimeter of the wafer where more material was deposited in our running example than in the trenches 209 near the center of the wafer.

A likely outcome of polishing the thicker film material may be a residual material 302 left on the nitride layer 304 after the CMP process as explained earlier. The residual oxide may mask the nitride during a follow-on nitride etch, thus leaving residual nitride on the wafer as well. Although FIG. 3 may exaggerate the outcome somewhat since the trenches 205, 207 appear adjacent to one another, the shallow trenches at the outer radius of the wafer may have more material 305 in a trench 207 near the outside of the wafer than a similarly dimensioned trench 209 at the inner radius of the wafer. The film residue 305 remaining in the trench 207 may require a longer etching action in order to equal the material in the trench 209 where the material 306 was not as thick initially.

Thickness uniformity is important when forming shallow trenches for isolation and trench capacitors. The capacitance of a trench capacitor may be affected because of the extra material in the well. The extra material also may impact the access time of a memory circuit formed using the trench capacitors as charge storage devices. As the memory circuits are selected from various areas of the wafer, the access times may vary because of the change in the capacitance due to film non-uniformity.

Applying the etching process after a CMP process allows the etching solution to be applied to the non-uniform areas of material remaining in the trench. When the deposited material exhibits a film non-uniformity in a radial pattern measured prior to the CMP process, the material is selectively etched as described earlier. Further, any material 302 not removed from the surface because of the film non-uniformity may be selectively removed during this process. Therefore, the step height that varies across the surface of the wafer is treated in the same manner as the bulk non-uniform film.

For example, the shallow trenches, where the film oxide 303 and 305 was deposited in the trench, may have been initially thicker than the oxide over a trench 209 that was closer to the center of the wafer. The CMP process is designed to take material from the surface that falls within a mean thickness. Therefore, some residual oxide, where the residual oxide was thickest, may remain on the surface of the wafer or on features of the surface of the wafer. The spin process unit may remove these layers by etching predetermined areas of the wafer based on the film thickness prior to the CMP process.

In another embodiment, the film thickness of a wafer may correspond to a circular pattern that is not centered on the round wafer. The film thickness non-uniformity pattern may be slightly off-center. Many process tools rotate the wafer during the process to mitigate the natural non-uniformities of the process tools as explained earlier. If a process tool is out of round or the wafer was not centered, naturally the process will exhibit a non-centered radial non-uniformity. The "off-center" radial pattern may be accounted for by positioning the center of the non-uniformity on the substrate with the center of the spin susceptor 402 and proceed with the etching process. In such an "off-center pattern," care may be taken not to over-etch the outer region that may appear most uniform in reference to the rest of the wafer. Alternatively, that portion of the wafer may show thicker layer adding to the non-uniformity requiring further etching.

It is therefore intended that the foregoing detailed description be regarded as illustrative rather than limiting, and that it be understood that it is the following claims, including all equivalents, that are intended to define the spirit and scope of this invention.

We claim:

1. A method for planarizing non-uniform shallow trench isolation films comprising:
   a. polishing a wafer first with a chemical mechanical polish process to planarize the surface of the wafer following a shallow trench isolation process; and
   b. etching a radial thickness non-uniformity of a film in a spin etching process further comprising:
      i. mounting the wafer on a spin susceptor to center a rotational thickness non-uniformity in the film disposed on the wafer about the axis of the spin susceptor, the wafer being mounted off-center on the spin susceptor to remove a film non-uniformity that is radial and misaligned with the center of the wafer;
      ii. adjusting a rotational speed of the wafer on the spin susceptor;
      iii. varying a position of a nozzle along the radius of the wafer to apply an etching solution to the wafer;
      iv. modifying the flow of the etching solution through the nozzle; and
      v. coordinating the rotational speed of the wafer and the position of the nozzle to maximize the removal of layer material contributing to the film non-uniformity.

2. The method of claim 1, further comprising modifying the temperature of the etch solution.

3. The method of claim 1, where the rotational speed of the spin susceptor is adjusted to adjust the residence time of the etching solution on the wafer.

4. The method of claim 1, further comprising positioning the nozzle to apply the etching solution to an area of the wafer to remove the thickest portion of the film non-uniformity.

5. The method of claim 4, where the nozzle applies the etching solution to a radial position that corresponds to 30-50% of the step height of the non-uniformity.

6. The method of claim 1, further comprising etching the wafer based on the non-uniform pattern prior to the CMP process.

7. The method of claim 1, where the material to be etched is a shallow trench isolation (STI) oxide.

8. The method of claim 1, where the material to be etched comprises a nitride.

9. The method of claim 1, where the material to be etched comprises a metal.

10. The method of claim 1, where the material to be etched comprises silicon.

11. A method for planarizing non-uniform shallow trench isolation films comprising:
    a. etching the wafer based on a radial thickness non-uniformity of a film;
    a. subsequently, polishing the wafer first with a chemical mechanical polish process to planarize the surface of the wafer following a shallow trench isolation process; and
    b. etching the radial thickness non-uniformity of the film in a spin etching process further comprising:
       i. mounting the wafer on a spin susceptor to center a rotational thickness non-uniformity in the film disposed on the wafer about the axis of the spin susceptor;
       ii. adjusting a rotational speed of the wafer on the spin susceptor;
       iii. varying a position of a nozzle along the radius of the wafer to apply an etching solution to the wafer;
       iv. modifying the flow of the etching solution through the nozzle; and
       v. coordinating the rotational speed of the wafer and the position of the nozzle to maximize the removal of layer material contributing to the film non-uniformity.

12. The method of claim 11, further comprising modifying the temperature of the etch solution.

13. The method of claim 11, where the wafer is mounted off-center on the spin susceptor to remove a film non-uniformity that is radial and misaligned with the center of the wafer.

14. The method of claim 11, where the rotational speed of the spin susceptor is adjusted to adjust the residence time of the etching solution on the wafer.

15. The method of claim 11, further comprising positioning the nozzle to apply the etching solution to an area of the wafer to remove the thickest portion of the film non-uniformity.

16. The method of claim 15, where the nozzle applies the etching solution to a radial position that corresponds to 30-50% of the step height of the non-uniformity.

17. The method of claim 11, further comprising etching the wafer based on the non-uniform pattern prior to the CMP process.

18. The method of claim 11, where the material to be etched is a shallow trench isolation (STI) oxide.

19. The method of claim 11, where the material to be etched comprises a nitride.

20. The method of claim 11, where the material to be etched comprises a metal.

21. The method of claim 11, where the material to be etched comprises silicon.

* * * * *